(12) United States Patent
Dziomkina et al.

(10) Patent No.: US 8,993,220 B2
(45) Date of Patent: Mar. 31, 2015

(54) IMMERSION LITHOGRAPHIC APPARATUS AND A DEVICE MANUFACTURING METHOD

(75) Inventors: Nina Vladimirovna Dziomkina, Eindhoven (NL); Olga Vladimirovna Elisseeva, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 598 days.

(21) Appl. No.: 12/756,735

(22) Filed: Apr. 8, 2010

(65) Prior Publication Data

US 2010/0279232 A1 Nov. 4, 2010

Related U.S. Application Data

(60) Provisional application No. 61/168,302, filed on Apr. 10, 2009, provisional application No. 61/249,358, filed on Oct. 7, 2009.

(51) Int. Cl.
*G03F 7/20* (2006.01)
*G03B 27/58* (2006.01)

(52) U.S. Cl.
CPC ............ *G03B 27/58* (2013.01); *G03F 7/70341* (2013.01); *G03F 7/70716* (2013.01)
USPC ............................................ 430/322; 355/71

(58) Field of Classification Search
CPC ..................... G03F 7/70341; H01L 21/67306; H01L 21/027
USPC ............................................. 430/322; 355/71
See application file for complete search history.

(56) References Cited

U.S. PATENT DOCUMENTS

| | | | |
|---|---|---|---|
| 4,509,852 A | 4/1985 | Tabarelli et al. | |
| 6,780,893 B2 | 8/2004 | Sugaya et al. | |
| 7,528,929 B2 | 5/2009 | Streefkerk et al. | |
| 7,561,250 B2 | 7/2009 | Liebregts et al. | |
| 7,697,111 B2 | 4/2010 | Shirai et al. | |
| 7,705,966 B2 | 4/2010 | Sakai et al. | |
| 7,709,813 B2 | 5/2010 | Sogard | |
| 8,045,138 B2 | 10/2011 | Ogusu | |
| 8,054,447 B2 | 11/2011 | Nagasaka et al. | |
| 2004/0136494 A1 | 7/2004 | Lof et al. | |
| 2004/0207824 A1 | 10/2004 | Lof et al. | |
| 2005/0074654 A1 | 4/2005 | Kiefer et al. | |
| 2006/0038968 A1 | 2/2006 | Kemper et al. | |
| 2006/0119809 A1 | 6/2006 | Verhagen et al. | |
| 2006/0192930 A1 | 8/2006 | Iimura et al. | |
| 2007/0229957 A1* | 10/2007 | Sogard | 359/584 |
| 2008/0212046 A1 | 9/2008 | Riepen et al. | |
| 2008/0316441 A1* | 12/2008 | Liebregts et al. | 355/30 |
| 2009/0206304 A1 | 8/2009 | Dziomkina | |
| 2009/0279060 A1 | 11/2009 | Direcks et al. | |
| 2010/0060868 A1 | 3/2010 | Tanasa et al. | |

FOREIGN PATENT DOCUMENTS

| | | |
|---|---|---|
| EP | 1 420 300 A2 | 5/2004 |
| JP | 02-068146 A | 3/1990 |
| JP | H04-215739 | 8/1992 |
| JP | 04-359031 | 12/1992 |
| JP | 06-025449 | 2/1994 |
| JP | H07-238259 | 9/1995 |
| JP | 11-263860 | 9/1999 |
| JP | 11-273695 A | 10/1999 |
| JP | 11-300270 | 11/1999 |
| JP | 11-320743 | 11/1999 |
| JP | 11-329124 | 11/1999 |
| JP | 2001-079484 | 3/2001 |
| JP | 2003-022709 A | 1/2003 |
| JP | 2003-038965 A | 2/2003 |
| JP | 2004-098351 | 4/2004 |
| JP | 2005-150734 | 6/2005 |
| JP | 2005-268759 | 9/2005 |
| JP | 2005-302880 | 10/2005 |
| JP | 2005-535734 A | 11/2005 |
| JP | 2006-270057 | 10/2006 |
| JP | 2006-319065 | 11/2006 |
| JP | 2006-350208 | 12/2006 |
| JP | 2007-266409 | 10/2007 |
| JP | 2007-290359 | 11/2007 |
| JP | 2007-305755 | 11/2007 |
| JP | 2007-305973 | 11/2007 |
| JP | 2007-335662 | 12/2007 |
| JP | 2008-015167 | 1/2008 |
| JP | 2008-182027 | 8/2008 |
| JP | 2008-192854 | 8/2008 |
| JP | 2009-004777 | 1/2009 |
| JP | 2009-016383 | 1/2009 |
| JP | 2009-054784 | 3/2009 |
| JP | 2009-194385 | 8/2009 |
| JP | 2010-128376 | 6/2010 |
| JP | 2010-527746 | 8/2010 |
| WO | 99/49504 A1 | 9/1999 |
| WO | WO 03/016384 A2 | 2/2003 |
| WO | 2005/020298 | 3/2005 |
| WO | 2005/064405 A2 | 7/2005 |
| WO | 2007/097466 | 8/2007 |

OTHER PUBLICATIONS

Japanese Notice of Allowance in JP 2007-282099, dated Dec. 21, 2010 (Cho, et al.).
Japanese Office Action dated Jan. 5, 2012 in corresponding Japanese Patent Application No. 2010-085600.

* cited by examiner

*Primary Examiner* — Daborah Chacko Davis
(74) *Attorney, Agent, or Firm* — Pillsbury Winthrop Shaw Pittman LLP (57) ABSTRACT

An immersion lithographic apparatus has a surface that in use is contacted by the immersion liquid and the surface has a surface roughness $R_a$ that is less than or equal to 0.2 µm. Immersion liquid on the surface may have a contact angle of 60° or greater. The surface may be able to maintain its properties so that immersion liquid on the surface may have the contact angle for a prolonged period of immersion in the immersion liquid.

20 Claims, 6 Drawing Sheets

IMMERSION LITHOGRAPHIC APPARATUS AND A DEVICE MANUFACTURING METHOD

This application claims priority and benefit under 35 U.S.C. §119(e) to U.S. Provisional Patent Application Ser. No. 61/168,302, entitled "An Immersion Lithographic Apparatus and A Device Manufacturing Method", filed on Apr. 10, 2009, and to U.S. Provisional Patent Application Ser. No. 61/249,358, entitled "An Immersion Lithographic Apparatus and A Device Manufacturing Method", filed on Oct. 7, 2009. The contents of those applications are incorporated herein in their entirety by reference.

FIELD

The present invention relates to an immersion lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desired. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate, or substrate and substrate table, in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Figure 2:
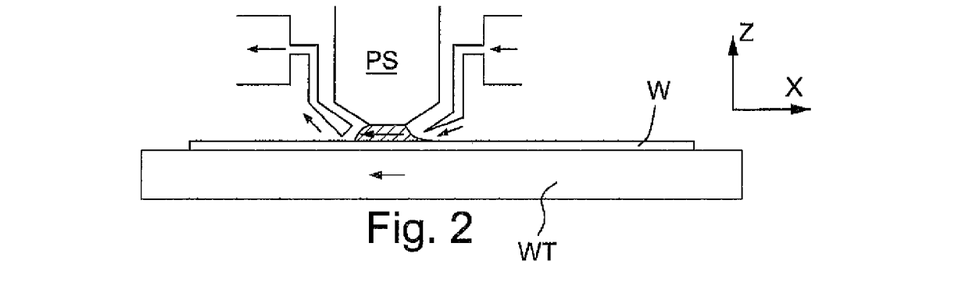
FIGS. 2 and 3 depict a liquid supply system for use in a lithographic projection apparatus.
Figure 3:
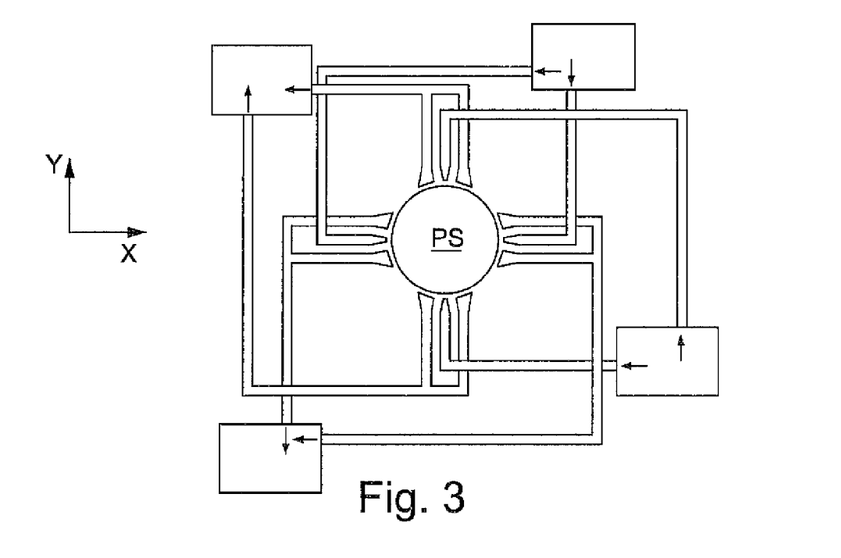

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
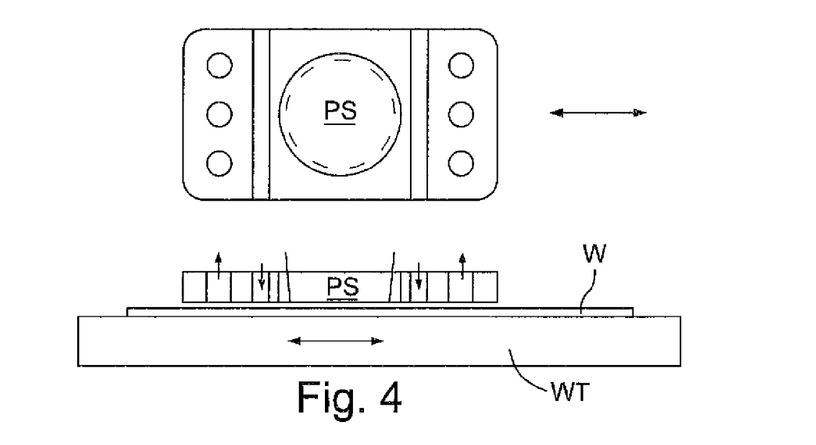
FIG. 4 depicts a further liquid supply system for use in a lithographic projection apparatus.

FIG. 4 schematically depicts a further exemplary liquid supply system for use in a lithographic projection apparatus, according to an embodiment of the present invention. A liquid is supplied by two groove inlets on either side of the projection system PS and is removed by a plurality of discrete outlets, arranged radially outwardly of the inlets. In the embodiment of FIG. 4, inlets and outlets are arranged within a plate having a hole through which a beam of radiation is projected. Liquid is supplied by one groove inlet on one side of the projection system PS and is removed by a plurality of discrete outlets on the other side of the projection system PS, thereby causing a flow of a thin film of liquid between the projection system PS and the substrate W. The choice of a combination of inlet and outlet incorporated within the liquid supply system can depend on the direction of movement of the substrate W (the other combination of inlet and outlets being inactive). In the cross-sectional view of FIG. 4, arrows illustrate the direction of liquid flow out of an inlet and into the outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication no. WO 2005/064405 discloses an all wet arrangement in which the immersion liquid is unconfined. In such a system substantially the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system may improve temperature control and processing of the substrate, evaporation of the immersion liquid can still occur. One way of alleviating that problem is described in United States patent application publication no. US 2006/119809 in which a member is provided which covers the substrate W in all positions and which is arranged to have immersion liquid extending between it and the top surface of the substrate and/or substrate table which holds the substrate.

SUMMARY

In immersion technology, it is common to use lyophobic (the term "liquidphobic" may also be used herein) materials or coatings in various parts of the apparatus to provide a surface which may be used control the immersion liquid and/or evaporation of liquid. For example, where the immersion liquid is water or water based, the surface may be hydrophobic.

It is desirable, for example, to increase the lyophobicity of a surface in an immersion lithographic apparatus. It is desirable, for example, to increase the lifetime of a lyophobic bulk material, surface or coating in an immersion lithographic apparatus.

According to an aspect, there is provided an immersion lithographic apparatus arranged to project an image onto a substrate through an immersion liquid, the apparatus having a surface that in use is contacted by the immersion liquid, wherein the surface has a surface roughness $R_a$ that is less than or equal to 0.2 μm and a contact angle to the immersion liquid that is greater than or equal to 60°.

According to an aspect, there is provided a device manufacturing method, comprising projecting a patterned beam of radiation onto a substrate through an immersion liquid provided in a space adjacent the substrate using a lithographic apparatus, wherein the apparatus has a surface that in use is contacted by the immersion liquid and the surface has a surface roughness $R_a$ that is less than or equal to 0.2 μm and a contact angle to the immersion liquid that is greater than or equal to 60°.

According to an aspect, there is provided a replaceable component of an immersion lithographic apparatus, the immersion lithographic apparatus arranged to project an image onto a substrate through an immersion liquid, the replaceable component having a surface that, in use, is contacted by the immersion liquid, wherein the surface has a surface roughness $R_a$ that is less than or equal to 0.2 μm and a contact angle to the immersion liquid that is greater than or equal to 60°.

According to an aspect, there is provided a shutter member for use in an immersion lithographic apparatus, the immersion lithographic apparatus arranged to project an image onto a substrate through an immersion liquid, the shutter member having a surface that, in use, is contacted by the immersion liquid, wherein the surface has a surface roughness $R_a$ that is less than or equal to 0.2 μm and a contact angle to the immersion liquid that is greater than or equal to 60°.

According to an aspect, there is provided a substrate table to support a substrate in an immersion lithographic apparatus, the immersion lithographic apparatus arranged to project an image onto the substrate through an immersion liquid, the substrate table having a surface that, in use, is contacted by the immersion liquid, wherein the surface has a surface roughness $R_a$ that is less than or equal to 0.2 μm and a contact angle to the immersion liquid that is greater than or equal to 60°.

According to an aspect, there is provided an immersion lithographic apparatus arranged to project an image onto a substrate through an immersion liquid, the apparatus having a surface that, in use, is intermittently contacted by the immersion liquid, wherein the surface has a surface roughness $R_a$ that is less than or equal to 1 μm and a receding contact angle to the immersion liquid that is greater than or equal to 79°.

According to an aspect, there is provided a method of manufacturing a device using a lithographic apparatus, the method comprising projecting a patterned beam of radiation onto a substrate through an immersion liquid provided in a space adjacent the substrate using the lithographic apparatus, wherein the apparatus has a surface that, in use, is intermittently contacted by the immersion liquid and the surface has a surface roughness $R_a$ that is less than or equal to 1 μm and a receding contact angle to the immersion liquid that is greater than or equal to 79°, greater than or equal to 80°, or greater than or equal to 82°.

According to an aspect, there is provided a shutter member for use in an immersion lithographic apparatus, the immersion lithographic apparatus arranged to project an image onto a substrate through an immersion liquid, the shutter member having a surface that, in use, is intermittently contacted by the immersion liquid, wherein the surface has a surface roughness $R_a$ that is less than or equal to 1 μm and a receding contact angle to the immersion liquid that is greater than or equal to 90°, greater than or equal to 80°, or greater than or equal to 82°.

According to an aspect, there is provided a substrate table for supporting a substrate in an immersion lithographic apparatus, the immersion lithographic apparatus arranged to project an image onto the substrate through an immersion liquid, the substrate table having surface that, in use, is intermittently contacted by the immersion liquid, wherein the surface has a surface roughness $R_a$ that is less than or equal to 1 μm and a receding contact angle to the immersion liquid that is greater than or equal to 79°, greater than or equal to 80°, or greater than or equal to 82°.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
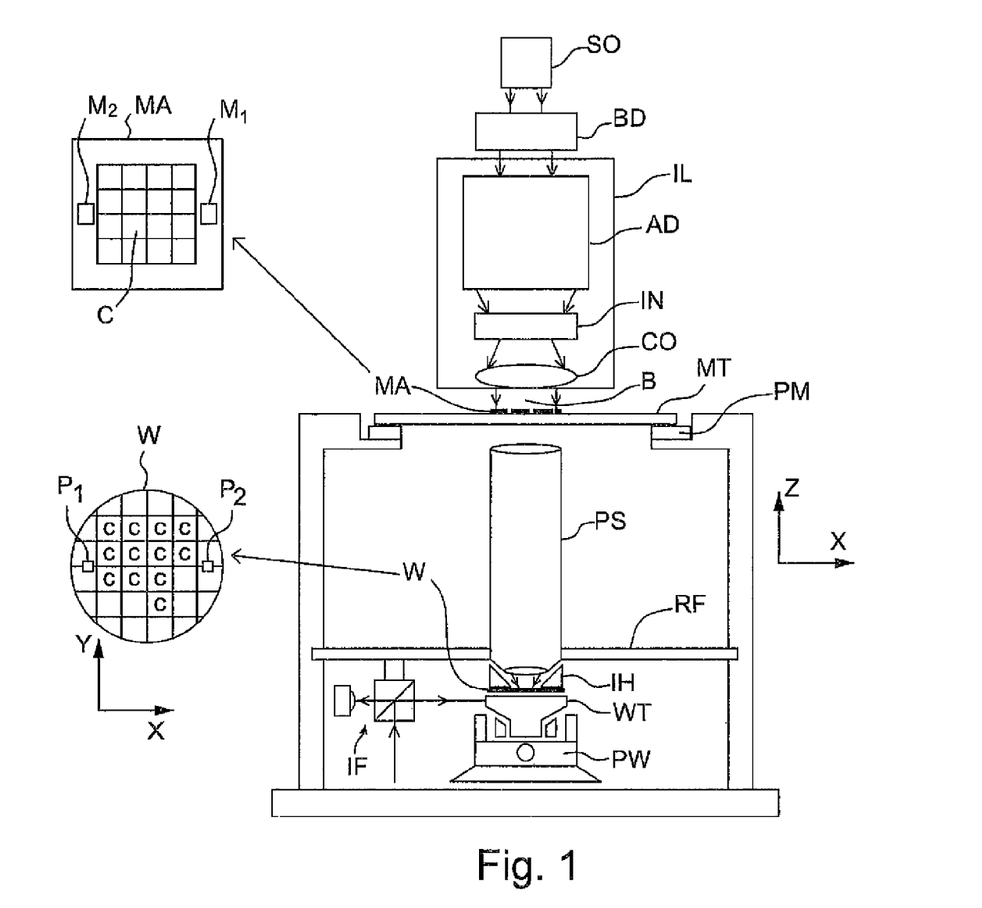
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to mask-less lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area.

A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area.

Figure 5:
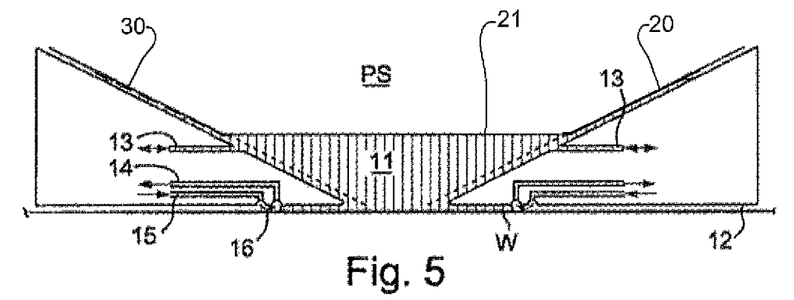
FIG. 5 depicts a further liquid supply system for use in a lithographic projection apparatus.

Four different types of localized liquid supply systems are illustrated in FIGS. 2-5. The liquid supply systems disclosed in FIGS. 2-4 were described above. Another arrangement which has been proposed is to provide the liquid supply system with a fluid confinement structure which extends along at least a part of a boundary of the space between the final element of the projection system and the substrate table. Such an arrangement is illustrated in FIG. 5.

The fluid confinement structure is substantially stationary relative to the projection system in the XY plane though there may be some relative movement in the Z direction (in the direction of the optical axis). In an embodiment, a seal is formed between the fluid confinement structure and the surface of the substrate. The seal may be a contactless seal such as a gas seal. Such a system is disclosed in United States patent application publication no. US 2004-0207824.

FIG. 5 schematically depicts a localized liquid supply system or fluid handling structure with a body 12 forming a barrier member or fluid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid handling structure is substantially stationary relative to the projection system PS in the XY plane though there may be some relative movement in the Z direction (in the direction of the optical axis). In an embodiment, a seal is formed between the body 12 and the surface of the substrate W and may be a contactless seal such as a gas seal or fluid seal.

The fluid handling device at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which may surround the space 11. Each annular groove may be continuous or discontinuous. The flow of gas is effective to contain the liquid in the space 11. In the cross-sectional view of FIG. 5, arrows illustrate the direction of fluid flow in and out of the body 12.

The example of FIG. 5 is a so called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in United States patent application publication no, US 2006-0038968.

In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 μm. In an embodiment, the porous material is at least slightly lyophilic (e.g., hydrophilic), i.e. having a static contact angle of less than 90° relative to the immersion liquid, e.g. water.

Another arrangement which is possible is one which works on a gas drag principle. The so-called gas drag principle has been described, for example, in United States patent application publication no. US 2008-0212046 and United States patent application publication no. 2009/0279060. In that system the extraction holes are arranged in a shape which desirably has a corner. The corner may be aligned with the stepping and scanning directions. This reduces the force on the meniscus between two openings in the surface of the fluid handling structure for a given speed in the step or scan direction compared to if the two outlets were aligned perpendicular to the direction of scan.

An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in United States patent application publication no. US 2010/0060868.

In all types of immersion lithographic apparatus and liquid handling structures, one or more lyophobic surfaces may be used to assist in controlling the immersion liquid. A lyophobic surface is a surface on which liquid, e.g. immersion liquid such as in the form of a droplet, will exhibit a high contact angle. For example, in an embodiment a lyophobic surface is a surface on which liquid will exhibit a receding contact angle of greater than 60°. In an embodiment the receding contact angle of liquid on the surface may be greater than 70°, greater than 75°, greater than 80° or greater than 90°. In an embodiment, liquid may have a receding contact angle with the surface of no greater than 100°. (Note that although the contact angle is in reference to a liquid on a surface, reference is sometimes made in this description to a contact angle of a surface. It is intended that such references are to the properties of the surface which determine the contact angle of liquid on the surface.)

A high receding contact angle is desirable in some cases because the critical scan speed of the substrate, that is the highest scan speed at which substantially no liquid loss is observed, increases with receding contact angle of the surface that is being scanned underneath the immersion liquid. Critical scan speed may also depend upon the shape, size and design of the liquid handling structure and scan length but for a given handling structure, the critical scan speed is generally higher with higher receding contact angle. It is also desirable for the top surface of the substrate table surrounding the substrate to have a receding contact angle the same as or higher than the receding contact angle of the substrate. This enables the scan speed to be set at the maximum permitted by the substrate with substantially no liquid loss occurring when the scan passes over the edge of the substrate. The receding contact angle of liquid on the substrate may depend on the resist or any topcoat used. For maximum versatility, it is desirable that the surface of a substrate table surrounding the substrate has a receding contact angle of known resists and topcoats. Known resists and topcoats have receding contact angles for water of for example, 69°, 94°, 75° and 79°. More recent resists have tended to provide a higher receding contact angle and it is presently anticipated that resists will be developed in the future having still higher receding contact angles. To maintain liquid loss below an acceptable level under normal operating conditions, it is desirable that certain parts of a lithographic apparatus (for example a swap bridge) have a receding contact angle of not less than 80° or not less than 82°.

The contact angle may be measured dynamically at room temperature (20° C.) and atmospheric pressure. Water contact angles may be determined with any type of goniometer, for example a FTA 200 Dynamic Contact Angle Analyser (available from Camtel Ltd, Elsworth, Cambridgeshire, UK) at room temperature.

Unless otherwise specified, in the description below contact angles mentioned are receding contact angles measured dynamically. The examples below relate to the use of ultra pure water as the immersion liquid, but the principles described also apply to other immersion liquids, including water with one or more additives. Unless otherwise specified, surface roughnesses referred to below are arithmetic average roughnesses, denoted $R_a$, and may be measured by an atomic force microscope or by a profilometer, e.g. an optical imaging profiler.

As an example, the last optical element, e.g., lens, of the projection system, which comes into contact with the immersion fluid, may be provided with a lyophobic coating in the areas outside the beam path. Without a coating, a droplet may form on the optical element surface. The location of the droplet may be unpredictable so that one or more droplets may be irregularly located over the optical element surface. A droplet on a surface may be of any size and shape and cover part or all of a surface. For present purposes, a film covering all or a substantial part of a surface is considered a droplet. A coating reduces, if not prevents, liquid staying on the surface of the optical element. By preventing, or restricting, liquid remaining on the optical element surface, evaporation of liquid on the surface is reduced, reducing the thermal load applied to the optical element. There may be less cooling of the optical element. Cooling of the optical element, especially localized cooling such as caused by evaporation of a liquid droplet particularly if irregularly located, is undesirable as it leads to thermal distortion of the optical element. However, in practice it may be difficult to provide, and maintain over time, a desired surface contact angle (with respect to the immersion liquid) on any number of surfaces in an immersion lithography apparatus. Many surfaces in an immersion lithography apparatus are subject to continuous or frequent immersion in liquid, e.g. ultra pure water, and to intense ultraviolet radiation, either of which degrades separately or together many surfaces, including coatings and lyophobic bulk materials.

Figure 6:
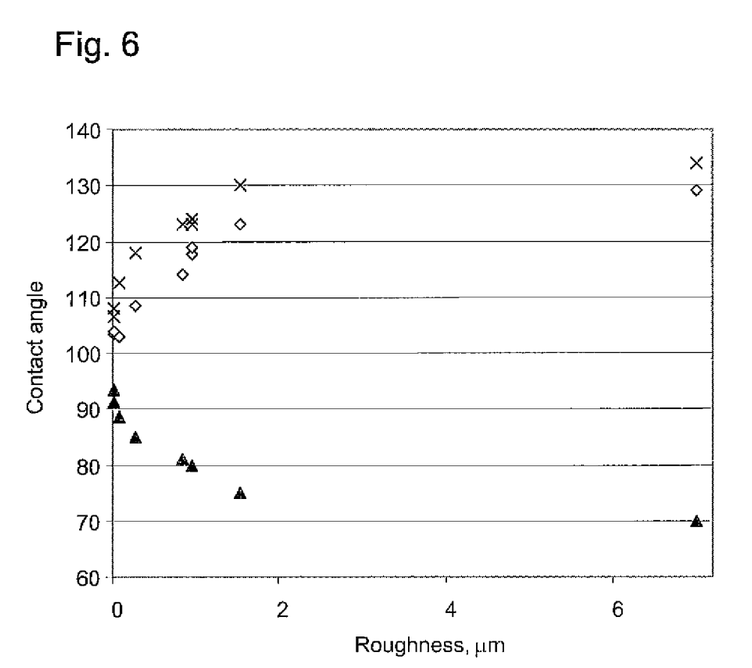
FIG. 6 is a graph showing the relationship between contact angle of water on an $SiO_xC_y$ coating and surface roughness of the coating.

The contact angle of a liquid-surface system depends in part on the surface roughness of the surface. This is illustrated in FIG. 6, which shows the dependency of the receding contact angle between 500 nm coatings (e.g. reformed coatings) of $SiO_xC_y$ on the surface roughness of the base layer. The values of x and y in the coating compound formula may each vary. The effects described below appear not to be sensitive to particular values of x and y. In the Figure, empty diamonds are measurements of static contact angle, crosses are measurements of advancing contact angle and solid triangles are measurements of receding contact angle. It will be seen that the difference between advancing and receding contact angles (so-called "hysteresis") increases with roughness of the base layer. The coatings in these cases are conformal, that is the coating follows (conforms to) the contour of the underlying base layer so that the surface roughness of the coating is essentially the same as the surface roughness of the underlying surface. Such conformal coatings may be applied by a vacuum deposition technique, such as Plasma-Enhanced Chemical Vapor Deposition (PECVD).

The same tendency in the contact angle behavior can be seen for many, if not all, coatings applied by a vacuum coating technique to a rough surface (in particular surfaces with a roughness greater than 1 nm) and a wet-chemical technique that leads to a conformal coating as well as to bulk lyophobic (e.g. hydrophobic) materials that possess some roughness after material processing. The coating thickness does not play an important role here, because the material/coating affinity to water depends on the effective surface roughness of the coating or bulk material. A coating applied using another technique may tend to fill in the declivities of the base layer so the surface roughness of the coating is less than that of the underlying base layer. In such a case, it can be advantageous to increase the roughness of the base layer to improve adhesion of the coating. As can be seen, the data of FIG. 6 suggests that a surface with a surface roughness of up to 4 μm would be suitable to provide the desired receding contact angle of 70°.

However, the surface roughness of a lyophobic surface has a substantial impact on the lifetime of the lyophobicity of that surface, which may be coated. This is shown in FIGS. 7 and 8 which represent the results of further experiments.

Figure 7:
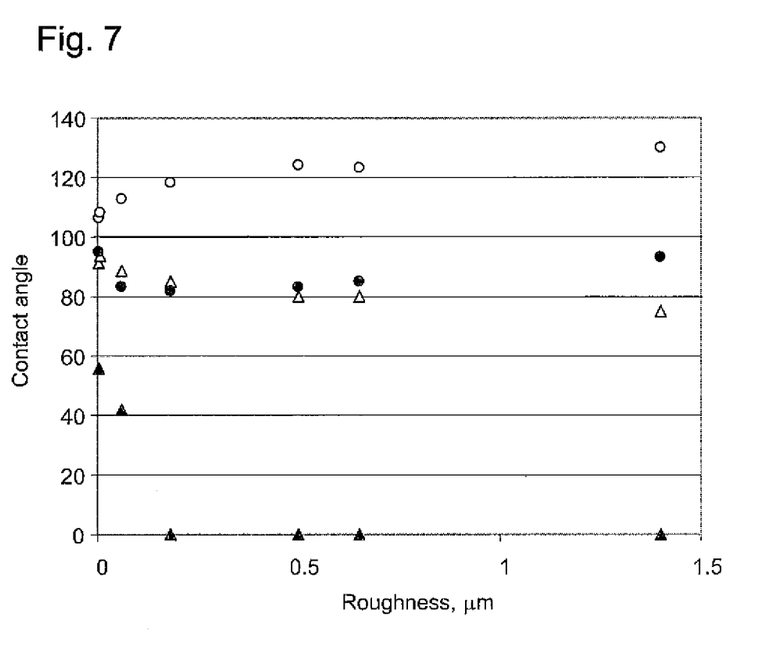
FIG. 7 is a graph showing the relationship between receding and advancing contact angles of water on an $SiO_xC_y$ coating and surface roughness of the coating before and after a period of immersion in water.

FIG. 7 represents the results of experiments in which coatings of 500 nm thickness $SiO_xC_y$ on base layers of different surface roughness were continuously immersed in ultra pure water for a period of 7 days. The advancing and receding contact angles of the surfaces to ultra pure water were measured before and after the immersion. In this Figure triangles indicate measurements of receding contact angle and circles represent measurements of advancing contact angle. Open shapes (e.g., open triangles and circles) are initial measurements and solid shapes (e.g., solid triangles and circles) are measurements after the period of immersion. As can be seen, although all samples, with surface roughnesses up to 1.4 μm, met or exceeded the desired contact angle of 70° before immersion, the contact angle was substantially reduced, in many cases to near 0°, after 7 days of exposure to (specifically immersion in) ultra pure water.

The results also show that for rougher underlying surfaces, the reduction in contact angle is greatest. It is believed that this effect occurs because the degradation of the coating due to immersion in the ultra pure water is homogenous. Rougher surfaces have higher surface area so they experience greater degradation. The higher the surface area, the greater is the overall effect on the contact angle degradation. Another possible mechanism for the increased rate of degradation is that the internal pressure inside a water droplet on a (microscopically) arched surface is greater that that of a droplet on a straight or smooth surface. In some cases, one or more additives are included in ultra pure water used as the immersion liquid. It is expected that such additive(s) will not substantially change the stability of the receding contact angle (the 'RCA') of the coatings discussed above.

Figure 8:
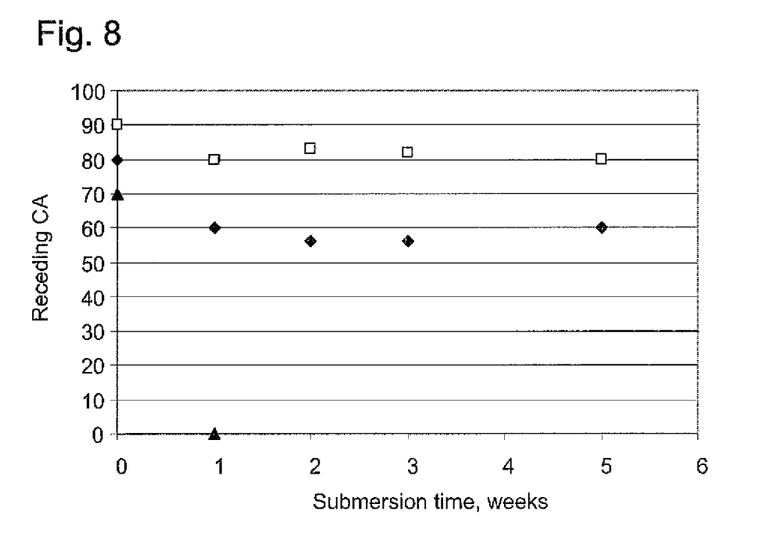
FIG. 8 is a graph showing the relationship between receding contact angle of water on an $SiO_xC_y$ coating and duration of immersion in water for three samples of different surface roughness.

FIG. 8 represents the results of a further experiment in which three samples, with a surface roughness $R_a$ of 0.04 μm, 0.4 μm and 5 μm respectively were immersed in stagnant ultra pure water for an extended period (5 weeks) and their contact angles to ultra pure water measured at weekly intervals. As can be seen, the receding contact angle of the sample with surface roughness 5 μm (solid triangles) declined to near 0° in a week. Although the contact angle of the sample with surface roughness 0.04 μm (open squares) declined initially, it remained substantially constant at about 80° thereafter. The sample of surface roughness 0.4 μm (solid diamonds) also exhibited a declining receding contact angle initially, but the receding contact angle stabilized at about 60°. It is believed from these results that the surface roughness of 0.2 μm or less would provide sufficient stability of receding contact angle.

Although the experiments above were performed with a conformal coating whose surface roughness was defined by the underlying base layer, the same or similar behavior is expected of a surface of a thicker or non-conformal coating and of a bulk material. This indicates that a hydrophobic surface having a surface roughness of less than 0.2 μm would be suitable for use in an immersion lithographic apparatus or a liquid handling apparatus.

Figure 9:
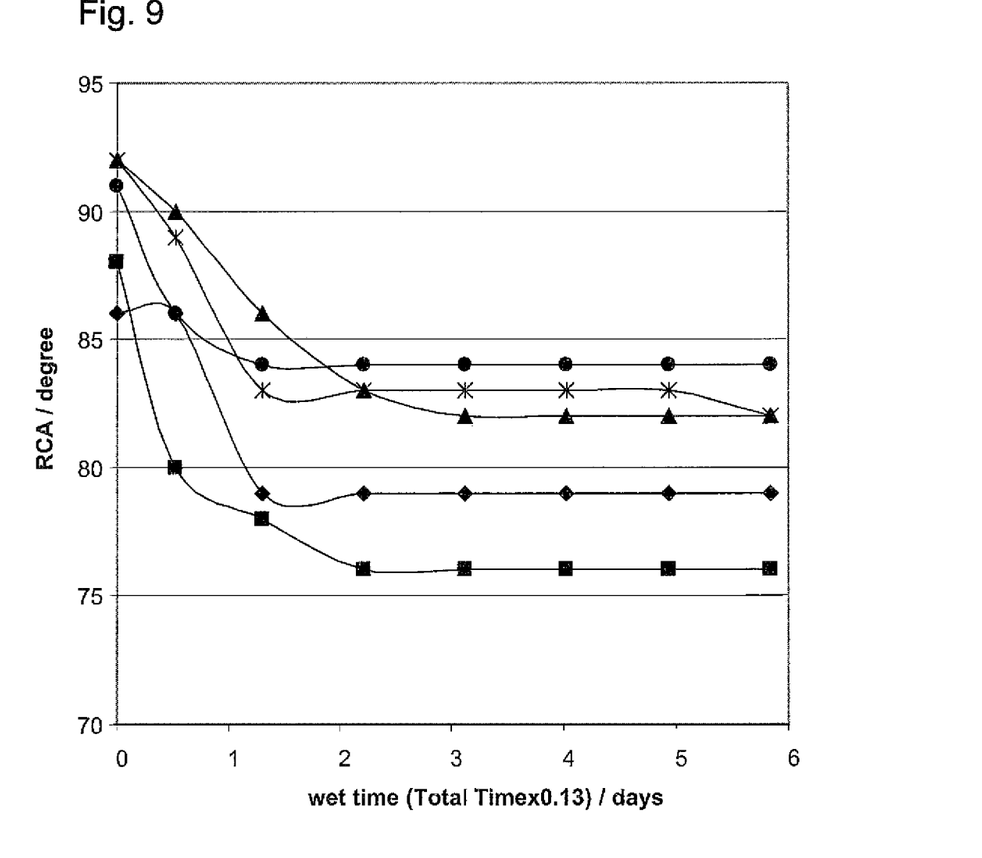
FIG. 9 is a graph showing the relationship between receding contact angle of water on an $SiO_xC_y$ coating and total wet time for five samples of different surface roughness intermittently immersed in water.

FIG. 9 represents the results of a further experiment in which five samples were intermittently immersed in ultra pure water over a period of 45 days. FIG. 9 shows the variation of the receding contact angle for each sample as a function of the actual time immersed in water. In the experiment, the samples were placed on a rotating carousel so as to be repeatedly immersed and removed from the ultra pure water. The speed of rotation of the carousel was such that each sample spent approximately 13% of the experiment time immersed in water and the remaining time in air. In a lithographic apparatus operating at more than 100 wafers per hour, various parts, e.g. parts of the substrate table and the swap bridge, will be wetted for a few milliseconds only (e.g., at each wafer swap). The immersion time of the carousel was therefore set so that the total equipment period was equivalent to several years use under normal operating conditions.

The samples comprise a coating of 500 nm thickness of SiOxCy on various different substrate material. The specific substrates were:

| Graph Symbol | Substrate Material | Surface Roughness $R_a$ (nm) | RCA after 5.85 days total wet time (°) |
|---|---|---|---|
| square | bilatal Al | 1100 | 76 |
| diagonal | bilatal Al | 1000 | 79 |
| triangle | opalized Al | 600 | 82 |
| asterisk | Ti | 500 | 82 |
| circle | Electro polished stainless steel | 100 | 84 |

"Bilatal Al" indicates aluminum that has been anodized in oxalic acid. It can be seen from the graph that the substrates with a surface roughness $R_a$ equal to or less than 1000 nm can achieve a RCA of equal to or greater than 79% that is stable after an extended period of intermittent immersion in ultra pure water. Although it is clear that the substrate material also has an influence on stability of RCA, the above results and the experiments based on continuous immersion show that stability of RCA is strongly dependent on surface roughness.

Figure 10:
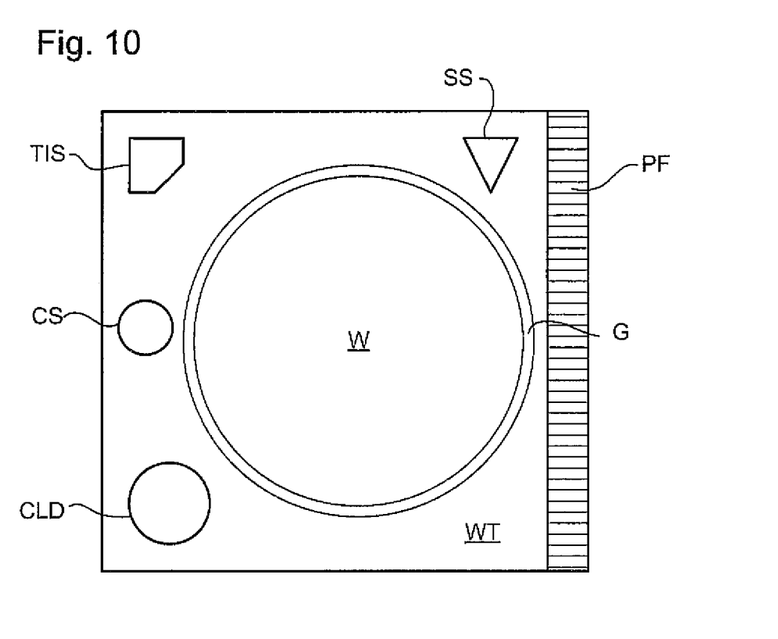
FIG. 10 depicts a substrate table according to an embodiment of the invention.
Figure 11:
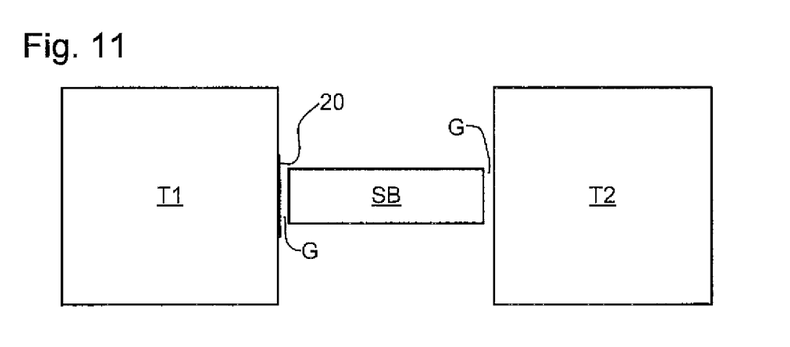
FIG. 11 depicts a pair of tables and a swap bridge according to an embodiment of the invention.
Figure 12:
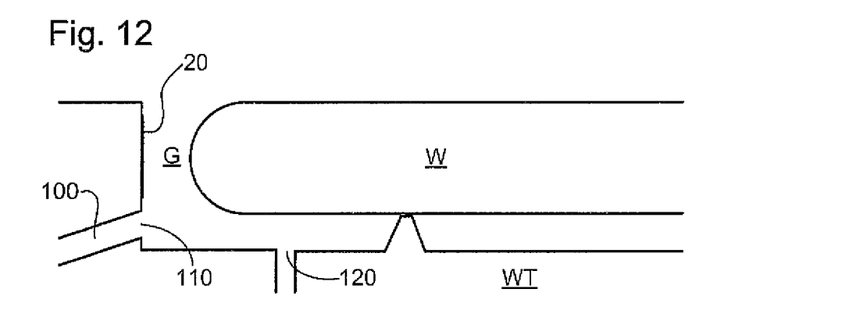
FIG. 12 depicts in cross-section a part of a substrate table according to an embodiment of the invention, and a substrate.

Parts of a lithographic apparatus where an embodiment of the invention may be applied may include a surface of: the projection system PS; a sensor; a substrate holder; a substrate table; a shutter member; the fluid handling structure; a cleaning station; a positioning feature; and/or a replaceable part. Some of these features are shown in FIGS. 10 to 12.

The surface of the projection system may be a part of the projection system which may be exposed to immersion liquid, for example the last optical element, in particular those parts outside the beam path. In an embodiment, a coating 20 is applied to the surface of the last element 21 of the projection system PS, as shown in FIG. 5.

The surface of the fluid handling structure 12 may be at least a part of a top surface of the fluid handing structure which may face a surface of the projection system. The surface may be at least a part of an undersurface of the fluid handling structure which in use would face a substrate, a substrate table or both.

The surface of a sensor may be a surface of a sensor which may be exposed to immersion liquid such as a transmission image sensor TIS, a spot sensor SS, a dose sensor, and/or a position sensor such as an interferometric sensor or an encoder. These sensors may be intermittently exposed to immersion fluid in use. In an embodiment a coating is applied to the surface of a sensor TIS, SS present on the substrate table WT as shown in FIG. 10.

The substrate holder may be used to support the substrate. The substrate table supports the substrate holder. In particular, an embodiment of the invention is relevant to the substrate table if it is made of a material such as cordierite (a magnesium iron aluminum cyclosilicate). In an embodiment the substrate holder is in a recess within the substrate table WT. The depth of the recess may be sized so that when a substrate is present on the substrate holder the surface of the substrate is co-planar with the surface of the substrate table. When a substrate is present on the substrate support, there may be a gap between the substrate edge and a facing edge of the substrate table. An embodiment of the invention may be applied to the surface of the substrate table, the surface of the substrate support which defines a gap, or both. Surfaces of the substrate table adjacent the substrate in particular may be intermittently exposed to immersion fluid in use. In an embodiment, a coating 20 is applied to a surface defining the gap G, as shown in FIGS. 10 and 12.

In the gap may be defined one or more gap openings of a fluid extraction device to remove liquid from the gap during operation. The gap opening 110 may be located near the edge of the substrate table (e.g. at a radially outward position to the substrate). Opening 110 (and/or one or more under-openings 120) may be present at or near the periphery of the substrate support. These openings may be covered by a substrate during operation, so that liquid may be removed from under the substrate through the openings. In an embodiment, a coating 20 is applied to a surface of fluid extraction device in a gap G, such as a gap opening 110, an under opening 120, an associated extraction conduit 100, or a combination of more than one of these features, as shown in FIG. 12.

A shutter member is a component which contacts immersion liquid during, e.g., substrate swap. The shutter member is arranged to face the fluid handling structure instead of a substrate during, e.g., substrate swap to maintain immersion liquid in the immersion space 11. The shutter member may be a closing disc, measurement table or swap bridge. Note that the swap bridge may be a removable component which is in place between two tables T1, T2 during substrate swap to enable the fluid handling structure to be transferred from one table to another. A fluid extraction device may be located in a gap between the shutter member and the substrate table, such as a gap between the swap bridge and a table T1. The two tables can be: two substrate tables or a substrate table and a measurement table. In an embodiment a coating is applied to the surface of a closing disc CD present on the substrate table WT as shown in FIG. 10. In an embodiment a coating is applied to the surface of a swap bridge such as a body SB of the swap bridge or a part of the substrate table WT at a location near the swap bridge body during substrate swap, for example coating 20 as shown in FIG. 11.

The cleaning station CS, which is an example of a fluid handling structure, may be located on a substrate table or a measurement table. It may be used to clean a surface of the projection system PS which is arranged to contact immersion liquid, such as the last optical element. In an embodiment it is arranged to clean a surface of a fluid handling structure, such as a specific feature of the fluid handling structure such as a liquid removal feature which may be located on the undersurface of the liquid handling structure.

The positioning feature PF may be used to position the substrate table and so the substrate relative to the projection system. The positioning feature may be located on a surface of the substrate table, such as a periphery of the substrate table. In an embodiment the positioning feature is present along substantially the entire edge of the substrate table. The positioning feature may have graduated markings, such as a grid plate, and may be arranged for use with an encoder. A coating having a desired lyophobicity may be provided over or around the markings.

In an embodiment of the invention, a sticker may be adhered to an underlying surface to provide a surface with a specific static or receding contact angle at a location where, for example, the underlying material cannot provide a stable contact angle, the surface is difficult to coat or the surface contact angle has limited life time, so that the surface needs to be intermittently reconditioned to maintain the contact angle of the surface within specification and operational requirements. Such a sticker is an example of a replaceable component. A sticker may be applied to any of the aforementioned parts. In an embodiment a sticker 30 is applied to the surface of the last element 21 of the projection system PS, as shown in FIG. 5. In an embodiment a sticker is applied to at least a part of the surface of a table WT, T1, T2 such as a substrate table or measurement table as shown in FIG. 10 and FIG. 11.

The desired surface roughness can be achieved by a known polishing technique appropriate to the material and component to which an embodiment of the invention is applied. In practice, a surface roughness as low as 1 nm may be obtained.

An embodiment of the invention is believed to provide an advantage in lowering the difference between receding and advancing contact angles, which may be referred to as hysteresis. In general the advancing contact angle is significantly higher than the receding contact angle and too high an advancing contact angle is undesirable. A high advancing contact angle is undesirable because it introduces the risk of bubble formation due to meniscus distortion, meniscus overrun and collisions of the meniscus with a liquid droplet. If the advancing contact angle is too high, it causes the immersion liquid to have menisci which when they interact, interact destructively at operational scan speed so that the liquid droplet does not simply join the liquid in the immersion space but disrupts the meniscus of the immersion space to cause the inclusion of a bubble.

As will be appreciated, any of the above described features can be used with any other feature and it is not only those combinations explicitly described which are covered in this application.

It will be appreciated that the above description makes reference to a material being lyophobic or lyophilic. This is relevant to any immersion liquid. In the case where the immersion liquid used is water the appropriate terms are hydrophilic and hydrophobic respectively. However, another liquid or fluid may be used as the immersion liquid. In this case the terms hydrophobic and hydrophilic should be read as being liquidphobic or liquidphilic or lipophobic or lipophilic.

An embodiment of the invention comprises an immersion lithographic apparatus arranged to project an image onto a substrate through an immersion liquid, the apparatus having a surface that in use is contacted by the immersion liquid, wherein the surface has a surface roughness $R_a$ that is less than or equal to 0.2 µm and a contact angle of the immersion liquid when on the surface that is greater than or equal to 60'.

In the immersion lithographic apparatus described above, the surface may comprise a base layer having a surface roughness $R_a$ that is less than or equal to 0.2 and a conformal coating thereon.

In the immersion lithographic apparatus described above, the conformal coating may be made of $SiO_xC_y$.

In the immersion lithographic apparatus described above, the conformal coating may have a thickness selected from the range of 2 nm to 500 µm. In an embodiment the conformal coating has a thickness in the range of 0.2 nm to 500 µm.

In the immersion lithographic apparatus described above, the surface may have a non-conformal coating and the outer surface of the coating may have a surface roughness $R_a$ that is less than or equal to 0.2 µm and a contact angle to the immersion liquid that is greater than or equal to 60°.

In the immersion lithographic apparatus described above, the surface may be a surface of a part of the apparatus selected from the group comprising: a surface of a projection system configured to contact immersion liquid (such as a last optical element, in particular a part of the last optical element that is not in the beam path); a sensor (such as a transmission image sensor, a spot sensor, an interferometric sensor); a substrate holder; a substrate table; a shutter member (swap bridge); a fluid handling structure; a replaceable component (a sticker) provided on a part of the apparatus configured to contact immersion liquid; a positioning feature; a surface of a liquid confinement structure (such as an upper or underneath side); or a fluid extraction device located in a gap between at least two selected from the group of; a substrate holder, a substrate table, or a shutter member.

In the immersion lithographic apparatus described above, the part may be the last optical element of a projection system and the surface having a surface roughness $R_a$ that is loss than or equal to 0.2 µm may be a surface of the last optical element that does not lie in the path of a projection beam.

An embodiment of the invention comprises a device manufacturing method, comprising projecting a patterned beam of radiation onto a substrate through an immersion liquid provided in a space adjacent the substrate using a lithographic apparatus, wherein the apparatus has a surface that, in use, is contacted by the immersion liquid and the surface has a surface roughness $R_a$ that is less than or equal to 0.2 µm and a contact angle of the immersion liquid when on the surface that is greater than or equal to 60°.

An embodiment of the invention comprises a replaceable component of an immersion lithographic apparatus, the immersion lithographic apparatus arranged to project an image onto a substrate through an immersion liquid, the replaceable component having a surface that, in use, is contacted by the immersion liquid, wherein the surface has a surface roughness $R_a$ that is less than or equal to 0.2 µm and a contact angle of the immersion liquid when on the surface that is greater than or equal to 60°.

An embodiment of the invention comprises a shutter member for use in an immersion lithographic apparatus, the immersion lithographic apparatus arranged to project an image onto a substrate through an immersion liquid, the shutter member having a surface that, in use, is contacted by the immersion liquid, wherein the surface has a surface roughness $R_a$ that is less than or equal to 0.2 µm and a contact angle of the immersion liquid when on the surface that is greater than or equal to 60°.

An embodiment of the invention comprises a substrate table for supporting a substrate in an immersion lithographic apparatus, the immersion lithographic apparatus arranged to project an image onto the substrate through an immersion liquid, the substrate table having a surface that, in use, is contacted by the immersion liquid, wherein the surface has a surface roughness $R_a$ that is less than or equal to 0.2 µm and a contact angle of the immersion liquid when on the surface that is greater than or equal to 60°.

In an aspect there is provided an immersion lithographic apparatus arranged to project an image onto a substrate through an immersion liquid. The apparatus has a surface that, in use, is intermittently contacted by the immersion liquid. The surface has a surface roughness $R_a$ that is less than or equal to 1 µm and a receding contact angle to the immersion liquid that is greater than or equal to 79°.

In an embodiment the surface comprises a base layer and a coating thereon, the surface of the base layer that is coated having a surface roughness $R_a$ that is less than or equal to 1 µm. The coating may be a conformal coating. The coating may comprise Si and O. The receding contact angle may be greater than or equal to 80°. The receding contact angle may be greater than or equal to 82°.

The surface may be a surface of a part of the apparatus selected from the group comprising: a surface of a projection system; a sensor; a substrate holder; a substrate table; a shutter member; a fluid handling structure; a replaceable component; a positioning feature; or a fluid extraction device. The surface of a projection system may be configured to contact immersion liquid. The surface of the projection system may be a last optical element, in particular a part of the last optical element that is not in the beam path. The sensor may be a transmission image sensor, a spot sensor or an interferometeric sensor. The shutter member may be a swap bridge, measurement table or closing disc. The replaceable component may be a sticker. The replaceable component may be provided on a part of the apparatus configured to contact the immersion liquid. The fluid extraction device may be located in a gap between at least two selected from the group of: a substrate holder, a substrate table, or a shutter member.

In an aspect there is provided a method of manufacturing a device using a lithographic apparatus, the method comprising: projecting a patterned beam of radiation onto a substrate through an immersion liquid provided in a space adjacent the substrate using the lithographic apparatus. The apparatus has a surface that, in use, is intermittently contacted by the immersion liquid. The surface has a surface roughness $R_a$ that is less than or equal to 1 μm. The surface has a receding contact angle to the immersion liquid that is greater than or equal to 79°, greater than or equal to 80°, or greater than or equal to 82°.

In an aspect there is provided a shutter member for use in an immersion lithographic apparatus. The immersion lithographic apparatus is arranged to project an image onto a substrate through an immersion liquid. The shutter member has a surface that, in use, is intermittently contacted by the immersion liquid. The surface has a surface roughness $R_a$ that is less than or equal to 1 μm. The surface has a receding contact angle to the immersion liquid that is greater than or equal to 90°, greater than or equal to 80°, or greater than or equal to 82°.

In an aspect there is provided a substrate table for supporting a substrate in an immersion lithographic apparatus. The immersion lithographic apparatus is arranged to project an image onto the substrate through an immersion liquid. The substrate table has a surface that, in use, is intermittently contacted by the immersion liquid. The surface has a surface roughness $R_a$ that is less than or equal to 1 μm. The surface has a receding contact angle to the immersion liquid that is greater than or equal to 79°, greater than or equal to 80°, or greater than or equal to 82°.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described herein may each or in combination be operable when one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

In an immersion apparatus, immersion fluid is handled by a fluid handling system, device, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus arranged to project an image onto a substrate through an immersion liquid, the apparatus having a surface that, in use, is contacted by the immersion liquid, wherein the surface has an arithmetic average surface roughness ($R_a$) that is greater than 0 and less than or equal to 0.2 μm and a receding contact angle to the immersion liquid that is greater than or equal to 60°.

2. The apparatus of claim 1, wherein the surface comprises a base layer and a conformal coating thereon, the surface of the base layer that is coated having an arithmetic average surface roughness ($R_a$) that is greater than 0 and less than or equal to 0.2 μm.

3. The apparatus of claim 2, wherein the conformal coating is made of $SiO_xC_y$.

4. The apparatus of claim 2, wherein the conformal coating has a thickness selected from the range of 2 nm to 500 μm.

5. The apparatus of claim 1, wherein the surface has a non-conformal coating and the outer surface of the coating has an arithmetic average surface roughness ($R_a$) that is greater than 0 and less than or equal to 0.2 μm and a receding contact angle to the immersion liquid that is greater than or equal to 60°.

6. The apparatus of claim 1, wherein the surface is a surface of a part of the apparatus selected from the group comprising: a portion of a projection system configured to contact immersion liquid; a sensor; a substrate holder; a substrate table; a shutter member; a fluid handling structure; a replaceable component provided on a portion of the apparatus configured to contact immersion liquid; a positioning feature; or a fluid extraction device located in a gap between at least two selected from the group of: the substrate holder, the substrate table, or the shutter member.

7. The apparatus of claim 1, wherein the surface having the arithmetic average surface roughness ($R_a$) that is greater than 0 and less than or equal to 0.2 μm is a surface of a last optical element of a projection system and the surface does not lie in the path of a projection beam.

8. A replaceable component of an immersion lithographic apparatus, the immersion lithographic apparatus arranged to project an image onto a substrate through an immersion liquid, the replaceable component having a surface that, in use, is contacted by the immersion liquid, wherein the surface has an arithmetic average surface roughness ($R_a$) that is greater than 0 and less than or equal to 0.2 μm and a receding contact angle to the immersion liquid that is greater than or equal to 60°.

9. A shutter member for use in an immersion lithographic apparatus, the immersion lithographic apparatus arranged to project an image onto a substrate through an immersion liquid, the shutter member having a surface that, in use, is contacted by the immersion liquid, wherein the surface has an arithmetic average surface roughness ($R_a$) that is greater than 0 and less than or equal to 0.2 μm and a receding contact angle to the immersion liquid that is greater than or equal to 60°.

10. A substrate table for supporting a substrate in an immersion lithographic apparatus, the immersion lithographic apparatus arranged to project an image onto the substrate through an immersion liquid, the substrate table having a surface that, in use, is contacted by the immersion liquid, wherein the surface has an arithmetic average surface roughness ($R_a$) that is greater than 0 and less than or equal to 0.2 μm and a receding contact angle to the immersion liquid that is greater than or equal to 60°.

11. An immersion lithographic apparatus arranged to project an image onto a substrate through an immersion liquid, the apparatus having a surface that, in use, is intermittently contacted by the immersion liquid, wherein the surface has an arithmetic average surface roughness ($R_a$) that is greater than 0 and less than or equal to 1 μm and a receding contact angle to the immersion liquid that is greater than or equal to 79°.

12. The apparatus of claim 11, wherein the surface comprises a base layer and a coating thereon, the surface of the base layer that is coated having an arithmetic average surface roughness ($R_a$) that is greater than 0 and less than or equal to 1 μm, the coating may be a conformal coating.

13. The apparatus of claim 12, wherein the coating comprises Si and O.

14. The apparatus of claim 11, wherein the receding contact angle is greater than or equal to 80°.

15. The apparatus of claims 11, wherein the receding contact angle is greater than or equal to 82°.

16. The apparatus of claim 11, wherein the surface is a surface of a part of the apparatus selected from the group comprising:
 a portion of a projection system configured to contact immersion liquid;
 a sensor;
 a substrate holder;
 a substrate table;
 a shutter member;
 a fluid handling structure;
 a replaceable component provided on a portion of the apparatus configured to contact the immersion liquid;
 a positioning feature; or
 a fluid extraction device located in a gap between at least two selected from the group of: the substrate holder, the substrate table, or the shutter member.

17. A shutter member for use in an immersion lithographic apparatus, the immersion lithographic apparatus arranged to project an image onto a substrate through an immersion liquid, the shutter member having a surface that, in use, is intermittently contacted by the immersion liquid, wherein the surface has an arithmetic average surface roughness ($R_a$) that is greater than 0 and less than or equal to 1 μm and a receding contact angle to the immersion liquid that is greater than or equal to 79°.

18. A substrate table for supporting a substrate in an immersion lithographic apparatus, the immersion lithographic apparatus arranged to project an image onto the substrate through an immersion liquid, the substrate table having a surface that, in use, is intermittently contacted by the immersion liquid, wherein the surface has an arithmetic average surface roughness ($R_a$) that is greater than 0 and less than or equal to 1 μm and a receding contact angle to the immersion liquid that is greater than or equal to 79°.

19. A sensor system component of an immersion lithographic apparatus, the immersion lithographic apparatus arranged to project an image onto the substrate through an immersion liquid, the sensor system component having a surface that, in use, is intermittently contacted by the immersion liquid, wherein the surface has an arithmetic average surface roughness ($R_a$) that is greater than 0 and less than or equal to 1 μm and a receding contact angle to the immersion liquid that is greater than or equal to 79°.

20. A sensor system component of an immersion lithographic apparatus, the immersion lithographic apparatus arranged to project an image onto the substrate through an immersion liquid, the sensor system component having a surface that, in use, is contacted by the immersion liquid, wherein the surface has an arithmetic average surface roughness ($R_a$) that is greater than 0 and less than or equal to 0.2 μm and a receding contact angle to the immersion liquid that is greater than or equal to 60°.

* * * * *